(12) United States Patent
Nie

(10) Patent No.: US 11,335,711 B2
(45) Date of Patent: May 17, 2022

(54) ARRAY SUBSTRATE, MANUFACTURING METHOD THEREOF, AND DISPLAY PANEL

(71) Applicant: WUHAN CHINA STAR OPTOELECTRONICS TECHNOLOGY CO., LTD., Hubei (CN)

(72) Inventor: Xiaohui Nie, Hubei (CN)

(73) Assignee: WUHAN CHINA STAR OPTOELECTRONICS TECHNOLOGY CO., LTD., Hubei (CN)

( * ) Notice: Subject to any disclaimer, the term of this patent is extended or adjusted under 35 U.S.C. 154(b) by 243 days.

(21) Appl. No.: 16/608,129

(22) PCT Filed: May 16, 2019

(86) PCT No.: PCT/CN2019/087140
§ 371 (c)(1),
(2) Date: Oct. 24, 2019

(87) PCT Pub. No.: WO2020/215404
PCT Pub. Date: Oct. 29, 2020

(65) Prior Publication Data
US 2021/0335823 A1    Oct. 28, 2021

(30) Foreign Application Priority Data
Apr. 25, 2019    (CN) .......................... 201910337921.X

(51) Int. Cl.
*H01L 27/12*    (2006.01)
*H01L 27/146*    (2006.01)

(52) U.S. Cl.
CPC .......... *H01L 27/124* (2013.01); *H01L 27/127* (2013.01); *H01L 27/1237* (2013.01); *H01L 27/14616* (2013.01)

(58) Field of Classification Search
CPC ............. H01L 27/124; H01L 27/14609; H01L 27/14614; H01L 27/14623; H01L 27/14616
See application file for complete search history.

(56) References Cited

U.S. PATENT DOCUMENTS

| 9,823,530 B2 * | 11/2017 | Sugimoto ......... G02F 1/136227 |
| 2012/0299004 A1 | 11/2012 | Liu et al. |
| 2016/0291434 A1 | 10/2016 | Sugimoto |
| 2016/0342048 A1 | 11/2016 | Huang |

FOREIGN PATENT DOCUMENTS

| CN | 104465675 A | 3/2015 |
| CN | 106019738 A | 10/2016 |
| CN | 109300917 A | 2/2019 |

* cited by examiner

*Primary Examiner* — David A Zarneke

(57) ABSTRACT

An array substrate, a manufacturing method thereof, and display panel are provided. Gate scanning lines and Light-shielding conductive layer are electrically connected, so that a width of the gate scanning line is substantially unchanged from the conventional technology to ensure an aperture ratio of a display panel. Therefore, an impedance of the wire used to transmit the scanning electrical signal is reduced, so that the display panel driving power consumption is reduced to increase the corresponding speed of pixel charging and discharging.

13 Claims, 3 Drawing Sheets

ARRAY SUBSTRATE, MANUFACTURING METHOD THEREOF, AND DISPLAY PANEL

FIELD OF INVENTION

The present disclosure relates to a display field, and in particular, relates to an array substrate, a manufacturing method thereof, and display panel.

BACKGROUND OF INVENTION

Low temperature poly silicon thin film transistors (LTPS-TFTs) have outstanding advantages, such as low preparation temperature, high carrier mobility, and small device sizes, and is a key technology for developing low power consumption and high integration display panels.

The principle of progressive scanning is based on matrix display, where the conductive channel of the TFT is in a truncated state, and the pixel circuit is in an off state at this time when the gate scanning line voltage of the progressive scan is lower than the threshold voltage of the TFT. The TFT conductive channel is in an on state, and the information voltage accessed by the source is loaded onto the pixel (drain) circuit and the storage capacitor, and the pixel circuit is in an on state when the gate scanning line voltage of the progressive scan is higher than the TFT threshold voltage. After the scanning is completed, the pixel row TFTs are all turned off, and the information voltage that has been written remains unchanged until the next frame is scanned and the information is rewritten. The gate scanning line metal impedance determines the power consumption of the driver circuit and the pixel charge and discharge response speed. In the actual production process, in order to ensure the aperture ratio of the liquid crystal display (LCD), the width of the gate scan line metal line is generally small, resulting in a large metal impedance and a significant increase in LCD drive power consumption.

As a result, it is necessary to propose a technical solution to solve the problem that the impedance of the scanning metal wire is large and the driving power consumption of the LCD is increased.

SUMMARY OF INVENTION

An object of the present disclosure is to provide an array substrate, a manufacturing method thereof, and display panel. Gate scanning lines and light-shielding conductive layer are electrically connected, so that drive power consumption is reduced when the display panel is working.

To achieve the above objects, the present disclosure provides an array substrate, wherein the array substrate includes a substrate, a light-shielding conductive layer formed on the substrate, a buffer layer covering the substrate and the light-shielding conductive layer, a channel layer formed on the buffer layer, a first insulating layer covering the buffer layer and the channel layer, and a plurality of gate scanning lines formed on the first insulating layer and located directly above the light-shielding conductive layer, wherein the gate scanning lines and the light-shielding conductive layer are electrically connected.

In one embodiment of the present disclosure, the light-shielding conductive layer includes a plurality of light-shielding conductive lines, and the light-shielding conductive lines are electrically connected to the gate scanning lines one-to-one by at least two through holes passing through the buffer layer and the first insulating layer.

In one embodiment of the present disclosure, an orthographic projection of each of the gate scanning lines on the substrate coincides with an orthographic projection of each of the light-shielding conductive lines correspondingly and electrically connected to the gate scanning lines on the substrate.

In one embodiment of the present disclosure, a size of the through hole along a first direction is greater than a width of the gate scanning line, and the first direction is a direction perpendicular to the gate scanning line.

In one embodiment of the present disclosure, the channel layer includes a plurality of interdigitated semiconductor components, the interdigitated semiconductor components are arranged in an array, and two opposite sides of each of the interdigitated semiconductor components are provided with at least one through hole, respectively.

In one embodiment of the present disclosure, the through holes include a first connection hole passing through the buffer layer and a second connection hole passing through the first insulation layer, and the first connection hole connects to the second connection hole.

In one embodiment of the present disclosure, an orthographic projection of the second connection hole on the substrate is located within an orthographic projection of the first connection hole on the substrate.

In one embodiment of the present disclosure, a preparation material of the light-shielding conductive layer is the same as a preparation material of the gate scanning lines.

To achieve the above objects, the present disclosure provides a manufacturing method of an array substrate, and the manufacturing method comprises steps of providing a substrate, forming a light-shielding conductive layer on the substrate, covering a buffer layer to the substrate and the light-shielding conductive layer, forming a channel layer to the buffer layer, covering a first insulating layer to the buffer layer and the channel layer, and forming a plurality of gate scanning lines on the first insulating layer, wherein the gate scanning lines are located directly above the light-shielding conductive layer, and the gate scanning lines and the light-shielding conductive layer are electrically connected.

In one embodiment of the present disclosure, the light-shielding conductive layer includes a plurality of light-shielding conductive lines, and the light-shielding conductive lines are electrically connected to the gate scanning lines one-to-one by at least two through holes passing through the buffer layer and the first insulating layer.

In one embodiment of the present disclosure, an orthographic projection of each of the gate scanning lines on the substrate coincides with an orthographic projection of each of the light-shielding conductive lines correspondingly and electrically connected to the gate scanning lines on the substrate.

In one embodiment of the present disclosure, a size of the through hole along a first direction is greater than a width of the gate scanning line, and the first direction is a direction perpendicular to the gate scanning line.

In one embodiment of the present disclosure, the channel layer includes a plurality of interdigitated semiconductor components, the interdigitated semiconductor components are arranged in an array, and two opposite sides each of the interdigitated semiconductor components are provided with at least one through hole, respectively.

In one embodiment of the present disclosure, the through holes include a first connection hole passing through the buffer layer and a second connection hole passing through the first insulation layer, and the first connection hole connects to the second connection hole.

In one embodiment of the present disclosure, an orthographic projection of the second connection hole on the substrate is located within an orthographic projection of the first connection hole on the substrate.

To achieve the above objects, the present disclosure provides a display panel, and the display panel includes an array substrate, wherein the array substrate includes a substrate, a light-shielding conductive layer formed on the substrate, a buffer layer covering on the substrate and the light-shielding conductive layer, a channel layer formed on the buffer layer, a first insulating layer covering on the buffer layer and the channel layer, and a plurality of gate scanning lines formed on the first insulating layer and located directly above the light-shielding conductive layer, wherein the gate scanning lines and the light-shielding conductive layer are electrically connected.

In one embodiment of the present disclosure, the light-shielding conductive layer includes a plurality of light-shielding conductive lines, and the light-shielding conductive lines are connected to the gate scanning lines one-to-one by at least two through holes passing through the buffer layer and the first insulating layer.

In one embodiment of the present disclosure, an orthographic projection of the gate scanning lines coincides with an orthographic projection of the light-shielding conductive lines electrically connected to the gate scanning lines on the substrate.

In one embodiment of the present disclosure, a size of the through hole along a first direction is greater than a width of the gate scanning line, and the first direction is a direction perpendicular to the gate scanning line.

In one embodiment of the present disclosure, the channel layer includes a plurality of interdigitated semiconductor components, the interdigitated semiconductor components are arranged in an array, and two opposite sides of each of the interdigitated semiconductor components are provided with at least one through hole, respectively.

An array substrate, a manufacturing method thereof, and display panel are provided. The gate scanning lines and the light-shielding conductive layer are electrically connected, so that the width of the gate scanning line is substantially unchanged from the conventional technology to ensure the aperture ratio of the display panel. Therefore, the impedance of the wire used to transmit the scanning electrical signal is reduced, so that the display panel driving power consumption is reduced to increase the corresponding speed of pixel charging and discharging.

DESCRIPTION OF DRAWINGS

In order to more clearly illustrate the embodiments or prior art technical solutions embodiment of the present disclosure, will implement the following figures for the cases described in prior art or require the use of a simple introduction. Obviously, the following description of the drawings are only some of those of ordinary skill in terms of creative effort without precondition, you can also obtain other drawings based on these drawings embodiments of the present disclosure.

DETAILED DESCRIPTION OF PREFERRED EMBODIMENTS

Structure and technical means adopted by the present disclosure to achieve the above and other objects can be best understood by referring to the following detailed description of the preferred embodiments and the accompanying drawings. Furthermore, directional terms described by the present disclosure, such as upper, lower, front, back, left, right, inner, outer, side, longitudinal/vertical, transverse/horizontal, etc., are only directions by referring to the accompanying drawings, and thus the used directional terms are used to describe and understand the present disclosure, but the present disclosure is not limited thereto.

Figure 1:
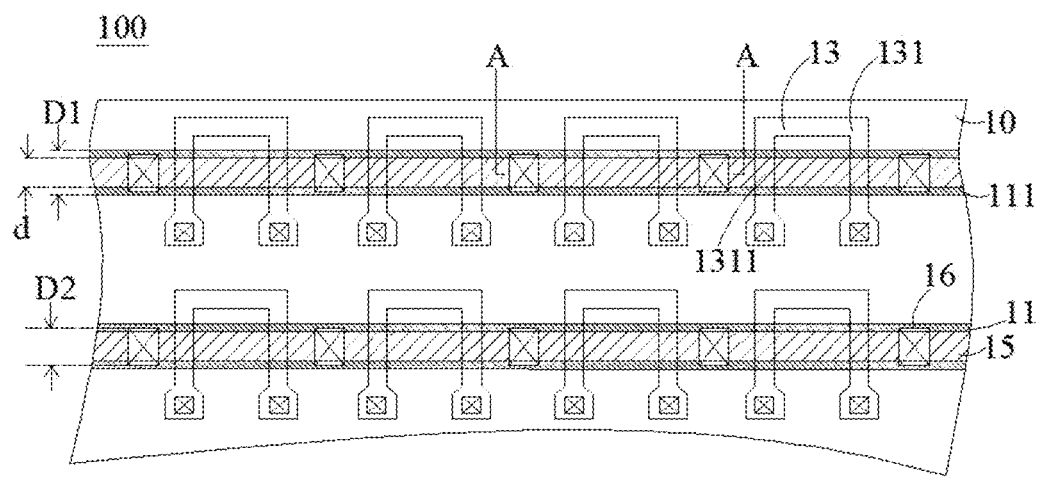
FIG. 1 is a schematic view of an array substrate according to a first embodiment of the present disclosure.
Figure 2:
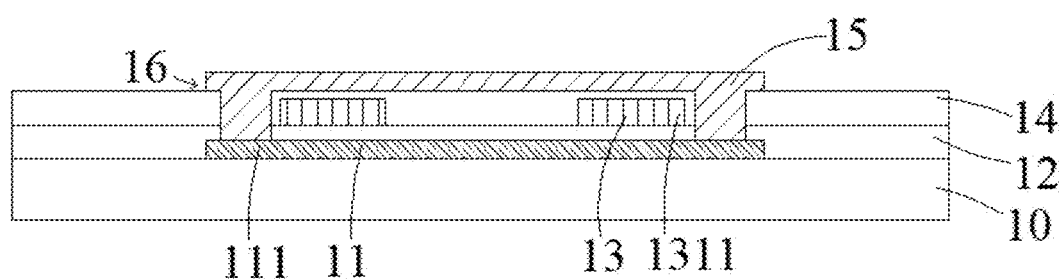
FIG. 2 is a cross-sectional view taken along line A-A of the array substrate shown in FIG. 1.

A schematic view of an array substrate according to a first embodiment of the present disclosure is illustrated in FIG. 1, and a cross-sectional view taken along line A-A of the array substrate shown in FIG. 1 is illustrated in FIG. 2. An array substrate 100 is a thin film transistor array substrate. That is, a plurality of thin film transistors (not shown) are disposed on a substrate 10. The array substrate 100 includes the substrate 10, a light-shielding conductive layer 11, a buffer layer 12, a channel layer 13, a first insulating layer 14, gate scanning lines 15, and through holes 16. The substrate 10 is a glass substrate or a flexible substrate.

The light-shielding conductive layer 11 is configured to prevent the backlight from being irradiated onto channels 1311 of the channel layer 13, thereby avoiding the problem of light leakage current in the channels 1311. The light-shielding conductive layer 11 is formed on the substrate 10, and the light-shielding conductive layer 11 includes a plurality of light-shielding conductive lines 111, and the light-shielding conductive lines 111 are arranged in parallel. A width D1 of each of the light-shielding conductive lines 111 is greater than a width d of the channel 1311 of each of the interdigital semiconductor members 131 in the channel layer 13 to prevent the backlight from being incident on the channels 1311. The gate scanning lines 15 and the light-shielding conductive layer 11 are electrically connected such that the light-shielding conductive layer 11 is also used to conduct a scanning electrical signal. Specifically, each of the light-shielding conductive lines 111 is electrically connected to each of the gate scanning lines 15 by at least two through holes 16 passing through the buffer layer 12 and the first insulating layer 14. For preparing the light-shielding conductive layer 11, the material is at least one of molybdenum, aluminum, titanium, and copper. The preparation material of the light-shielding conductive layer 11 and the gate scanning lines 15 are made of the same material.

The buffer layer 12 is configured to prevent metal ions (such as aluminum, strontium and sodium) in the substrate 10 from diffusing into the channel 1311 of the channel layer 13 in a thermal process to affect the electrical properties of the thin film transistor. The buffer layer 12 covers the substrate 10 and the light-shielding conductive layer 11. The buffer layer 12 is a silicon oxide layer and a silicon nitride layer covering the light-shielding conductive layer 11 and the substrate 10, wherein the silicon nitride layer is located on the side close to the substrate 10. The buffer layer 12 has a thickness of from 3,000 angstroms to 4,000 angstroms, and the buffer layer 12 is prepared by chemical vapor deposition.

The channel layer 13 is formed on the buffer layer 12, and the channel layer 13 includes a plurality of interdigital semiconductor members 131 arranged in an array. The interdigital semiconductor members 131 are located above the light-shielding conductive lines 111. The interdigital semiconductor members 131 are arranged in a plurality of rows, and interdigitated type. Each of the interdigital semiconductor members 131 has two channels 1311 in the same direction to reduce leakage current when the thin film transistor is in an off state. Each of the interdigital semiconductor members 131 has a source contact area and a drain contact area for electrically contacting a source electrode (not shown) and a drain electrode (not shown), respectively. The channel layer 13 is made of polysilicon, and also one of a metal oxide semiconductor or a single crystal silicon. The channel layer 13 is formed by chemical vapor deposition to form a whole surface of amorphous silicon, and the amorphous silicon is converted into polycrystalline silicon by an excimer laser annealing process. A yellow light process is then performed to pattern the polysilicon to form a plurality of array of interdigital semiconductor members.

The first insulating layer 14 is a gate insulating layer. The first insulating layer 14 covers the buffer layer 12 and the channel layer 13. The first insulating layer 14 is a silicon nitride layer. It can be understood that the first insulating layer 14 is a silicon oxide layer or a stack of a silicon oxide layer and a silicon nitride layer. The first insulating layer 14 has a thickness of 1000 angstroms to 1500 angstroms, and the first insulating layer 14 is prepared by chemical vapor deposition.

The gate scanning lines 15 are configured to transmit a scan electrical signal to control an operational state of the thin film transistor. The gate scanning lines 15 are formed on the first insulating layer 14 and directly above the light-shielding conductive layer 11, and also formed in the through holes 16 to electrically connect the gate scanning lines 15 on the first insulating layer 14 and the light-shielding conductive layer 11. The gate scanning lines 15 include a plurality of parallel metal lines. A width of each of gate scanning lines 15 is equal to a width d of the channel 1311. That is, the width d of each of the gate scanning lines 15 is smaller than the width D1 of each of the conductive shading lines 111. Specifically, each of the gate scanning lines 15 has a width of 3±0.1 mm. The gate scanning lines 15 are electrically connected to the light-shielding conductive layer 11 so that the width of the gate scanning lines 15 are substantially unchanged with respect to the conventional art. Therefore, the effective area of the wires for transmitting the scanning electrical signal (including the gate scanning lines 15 and the conductive light shielding layer 11) is increased, the resistance of the wire used to transmit the scanning electrical signal is significantly reduced, the power consumption of the scan drive circuit is reduced, and the speed of the charge and discharge response of the pixel (not shown) is increased.

The through holes 16 are configured to electrically connect the gate scanning lines 15 and the light-shielding conductive layer 11, and penetrate through the buffer layer 12 and the first insulating layer 14. Each of the opposite sides of the interdigital semiconductor members 131 is respectively provided with at least one through hole 16 to improve the yield of electrical connection between each of the light-shielding conductive lines 111 and the corresponding gate scan lines 15. The through holes 16 can reduce the resistance of the wires (gate scanning lines located in the through hole 16) connecting the gate scanning lines 15 and the light-shielding conductive layer 11. Specifically, each of the opposite sides of the interdigital semiconductor members 131 is respectively provided with a through hole 16. In the same row of interdigital semiconductor members 131, a through hole 16 is disposed between adjacent two interdigital semiconductor members 131 such that the through holes 16 are periodically distributed. After the through holes 16 are formed through the first insulating layer 14, a photoresist is formed on the first insulating layer 14, and a portion of the photoresist is exposed by the reticle. The first insulating layer 14 and the buffer layer 12 not covered by the photoresist are etched to form the through holes 16. A dimension D2 of the through hole 16 in a first direction is greater than the width D1 of the gate scanning line, wherein the first direction is a direction perpendicular to the gate scanning line 15 (the direction in which the gate scanning line extends). The first direction is parallel to the plane in which the substrate 10 is provided with the gate scanning lines, so that the gate scanning lines 15 in the through holes 16 are in full contact with the light-shielding conductive layer 11. Thereby, the impedance of the gate scanning lines 15 formed in the through holes 16 is lowered. The through hole 16 is circular, and the radius of the through hole 16 is greater than the width of the gate scanning line 15. The through hole 16 is also square, and the sides of the through hole 16 are longer than the width of the gate scanning line 15.

Figure 3:
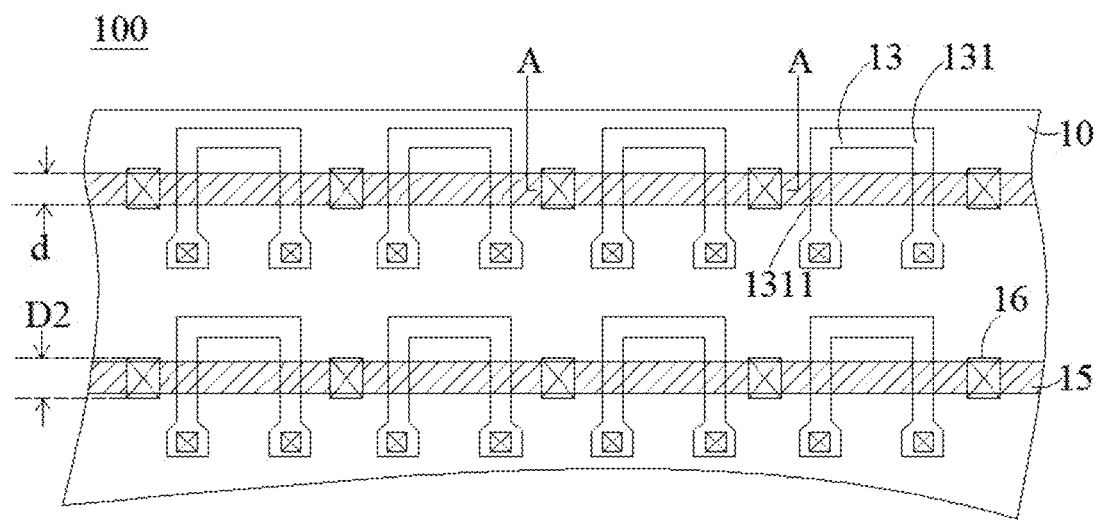
FIG. 3 is a schematic view of an array substrate according to a second embodiment of the present disclosure.
Figure 4:
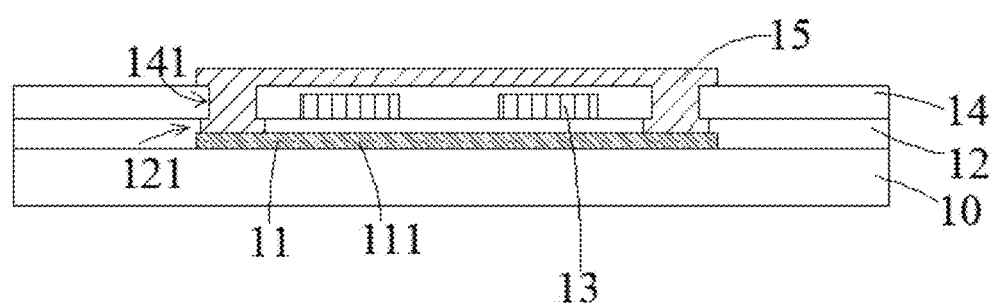
FIG. 4 is a cross-sectional view taken along line A-A of the array substrate shown in FIG. 3.

A schematic view of an array substrate according to a second embodiment of the present disclosure is illustrated in FIG. 3, and a cross-sectional view taken along line A-A of the array substrate shown in FIG. 3 is illustrated in FIG. 4. The array substrate 100 shown in FIG. 3 is substantially similar to the array substrate 100 shown in FIG. 1. The difference is that an orthographic projection of each of the gate scanning lines 15 on the substrate 10 coincides with an orthographic projection of each of the light-shielding conductive lines 111 electrically connected to the gate scanning lines 10 on the substrate 10. That is, each of the gate scanning lines 15 is identical to each of the light-shielding conductive lines 111 electrically connected to the gate scanning lines 15 (including the width d of the gate scanning line 15 and the width D1 of the light-shielding conductive line 111 being the same). In order to ensure that the light-shielding conductive line 111 generates a light-shielding effect, the aperture ratio of the display panel made of the array substrate is further improved. In addition, each of the through holes 16 includes a first connection holes 121 penetrating through the buffer layer 12 and a second connection holes 141 penetrating through the first insulation layer 14, wherein the first connection holes 121 are in communication with the second connection holes 141. An orthographic projection of the second connection hole 141 on the substrate 10 is located within an orthographic projection of the first connection hole 121 in the substrate 10. That is, the size of the first connection hole 121 is greater than the size of the second connection hole 141 to ensure that the second connection hole 141 can communicate with the first connection hole 121. After the buffer layer 12 is formed, the first connection holes 121 are formed by processing the buffer layer 121 through a yellow light process. After the first insulating layer 14 is formed, the second connection holes 141 are formed by processing the first insulating layer 14 through the yellow light process. The size of the second connection hole 141 in the first direction is greater than the width of each of the gate scanning lines 15. The first direction is a direction perpendicular to the gate scanning line 15.

In the array substrate of the present disclosure, the gate scanning lines and the light-shielding conductive layer are electrically connected, so that the width of the gate scanning line is substantially unchanged from the conventional technology to ensure the aperture ratio of the display panel. Therefore, the impedance of the wire used to transmit the scanning electrical signal is reduced, so that the display panel driving power consumption is reduced to increase the corresponding speed of pixel charging and discharging.

Figure 5:
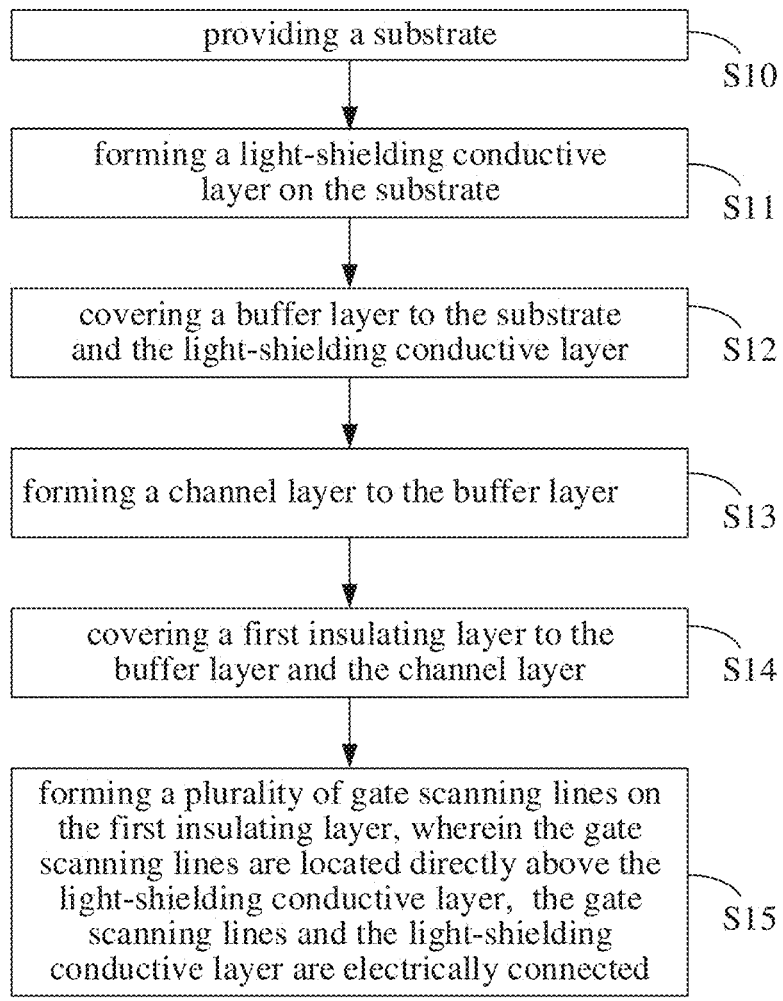
FIG. 5 is a flowchart of a manufacturing method of an array substrate according to a first embodiment of the present disclosure.

Referring to FIG. 5, a flowchart of a manufacturing method of an array substrate according to a first embodiment of the present disclosure is illustrated. The manufacturing method of the array substrate comprising steps of S10, S11, S12, S13, S14, and S15.

S10, providing a substrate.

S11, forming a light-shielding conductive layer on the substrate.

S12, covering a buffer layer to the substrate and the light-shielding conductive layer.

S13, forming a channel layer to the buffer layer.

S14, covering a first insulating layer to the buffer layer and the channel layer.

S15, forming a plurality of gate scanning lines on the first insulating layer, wherein the gate scanning lines are located directly above the light-shielding conductive layer, and the gate scanning lines and the light-shielding conductive layer are electrically connected.

In the manufacturing method of the array substrate of the present disclosure, the gate scanning lines and the light-shielding conductive layer are electrically connected, so that the width of the gate scanning line is substantially unchanged from the conventional technology to ensure the aperture ratio of the display panel. Therefore, the impedance of the wire used to transmit the scanning electrical signal is reduced, so that the display panel driving power consumption is reduced to increase the corresponding speed of pixel charging and discharging.

The present disclosure has been described with preferred embodiments thereof and it is understood that many changes and modifications to the described embodiments can be carried out without departing from the scope and the spirit of the disclosure that is intended to be limited only by the appended claims.

What is claimed is:

1. An array substrate, comprising:
    a substrate;
    a light-shielding conductive layer formed on the substrate;
    a buffer layer covering the substrate and the light-shielding conductive layer;
    a channel layer formed on the buffer layer, wherein the channel layer includes a plurality of interdigital semiconductor members arranged in an array, and each of the interdigital semiconductor members has two channels in a same direction;
    a first insulating layer covering the buffer layer and the channel layer; and
    a plurality of gate scanning lines formed on the first insulating layer and located directly above the light-shielding conductive layer;
    wherein the gate scanning lines and the light-shielding conductive layer are electrically connected.

2. The array substrate according to claim 1, wherein the light-shielding conductive layer includes a plurality of light-shielding conductive lines, and the light-shielding conductive lines are electrically connected to the gate scanning lines one-to-one by at least two through holes passing through the buffer layer and the first insulating layer.

3. The array substrate according to claim 2, wherein an orthographic projection of each of the gate scanning lines on the substrate coincides with an orthographic projection of each of the light-shielding conductive lines correspondingly and electrically connected to the gate scanning lines on the substrate.

4. The array substrate according to claim 2, wherein a size of the through hole along a first direction is greater than a width of the gate scanning line, and the first direction is a direction perpendicular to the gate scanning line.

5. The array substrate according to claim 2, wherein the interdigital semiconductor members are arranged in an array, and two opposite sides of each of the interdigital semiconductor members are provided with at least one through hole, respectively.

6. The array substrate according to claim 5, wherein the through holes include a first connection hole passing through the buffer layer and a second connection hole passing through the first insulation layer, and the first connection hole connects to the second connection hole.

7. The array substrate according to claim 6, wherein an orthographic projection of the second connection hole on the substrate is located within an orthographic projection of the first connection hole on the substrate.

8. The array substrate according to claim 1, wherein a preparation material of the light-shielding conductive layer is the same as a preparation material of the gate scanning lines.

9. A display panel, comprising an array substrate, wherein the array substrate comprises:
    a substrate;
    a light-shielding conductive layer formed on the substrate;
    a buffer layer covering on the substrate and the light-shielding conductive layer;
    a channel layer formed on the buffer layer, wherein the channel layer includes a plurality of interdigital semiconductor members arranged in an array, and each of the interdigital semiconductor members has two channels in a same direction;
    a first insulating layer covering on the buffer layer and the channel layer; and
    a plurality of gate scanning lines formed on the first insulating layer and located directly above the light-shielding conductive layer;
    wherein the gate scanning lines and the light-shielding conductive layer are electrically connected.

10. The display panel according to claim 9, wherein the light-shielding conductive layer includes a plurality of light-shielding conductive lines, and the light-shielding conductive lines are connected to the gate scanning lines one-to-one by at least two through holes passing through the buffer layer and the first insulating layer.

11. The display panel according to claim 10, wherein an orthographic projection of the gate scanning lines coincides with an orthographic projection of the light-shielding conductive lines electrically connected to the gate scanning lines on the substrate.

12. The display panel according to claim 10, wherein a size of the through hole along a first direction is greater than a width of the gate scanning line, and the first direction is a direction perpendicular to the gate scanning line.

13. The display panel according to claim 10, wherein the interdigital semiconductor members are arranged in an array, and two opposite sides of each of the interdigital semiconductor members are provided with at least one through hole, respectively.

* * * * *